(12) United States Patent
Whiston et al.

(10) Patent No.: US 7,710,787 B2
(45) Date of Patent: May 4, 2010

(54) METHOD OF ERASING AN EEPROM DEVICE

(75) Inventors: Seamus Paul Whiston, Raheen (IE); Denis J. Doyle, Patrickwell (IE); Mike O'Shea, Grenagh (IE); Thomas J. Lawlor, Mallow (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/401,719

(22) Filed: Apr. 11, 2006

(65) Prior Publication Data

US 2007/0237004 A1    Oct. 11, 2007

(51) Int. Cl.
G11C 16/06 (2006.01)
G11C 16/10 (2006.01)
G11C 16/12 (2006.01)
G11C 16/14 (2006.01)

(52) U.S. Cl. .............. 365/185.29; 365/185.1; 365/185.3; 365/185.14; 365/185.18; 365/185.24; 365/185.28

(58) Field of Classification Search ............. 365/185.1, 365/185.3, 185.14, 185.18, 185.24, 185.28, 365/185.29
See application file for complete search history.

(56) References Cited

U.S. PATENT DOCUMENTS

| | | | | |
|---|---|---|---|---|
| 5,537,358 A | * | 7/1996 | Fong | ............... 365/218 |
| 5,600,593 A | * | 2/1997 | Fong | ............... 365/185.19 |
| 5,680,350 A | * | 10/1997 | Lee | ............... 365/185.24 |
| 6,111,788 A | | 8/2000 | Chen et al. | |
| 6,278,635 B1 | | 8/2001 | Hara | |
| 6,300,662 B1 | | 10/2001 | Doyle et al. | |
| 6,324,095 B1 | * | 11/2001 | McPartland et al. | ..... 365/185.05 |
| 6,930,926 B2 | * | 8/2005 | Lin et al. | ............... 365/185.29 |
| 2002/0015327 A1 | * | 2/2002 | McPartland et al. | ..... 365/185.03 |
| 2002/0133679 A1 | * | 9/2002 | Choi et al. | ............... 711/154 |
| 2006/0104104 A1 | * | 5/2006 | Park et al. | ............... 365/100 |

OTHER PUBLICATIONS

Lee et al. "A Single Poly Flash Memory Intellectual Property for Low-Cost, Low-Density Embedded Nonvolatile Memory Applications" Journal of the Korean Physical Society, vol. 41, No. 6, Dec. 2002, pp. 846-850.*
Lee, JaiChul et al, "A single poly CMOS compatible embedded flash memory IP for low-cost applications", Dept. of Electrical, Electronic and Information Engineering, Wonkwang University, AP-SoC, Nov. 14, 2002.
PCT Search Report, PCT/EP2007/053377, Jul. 27, 2007.

* cited by examiner

*Primary Examiner*—J. H. Hur
(74) *Attorney, Agent, or Firm*—Kenyon & Kenyon LLP

(57) ABSTRACT

A method for erasing an EEPROM cell which reduces the need for monitoring algorithms. The potential at the erase gate is initially raised and the potential at the control gate is lowered to cause FN tunneling through the erase gate. A subsequent soft programming step is employed to raise the potential at the control gate to a value sufficient to cause FN tunneling to start though the oxide of the transistor. A new memory device structure suitable for practicing this method employs a transistor having a floating gate, where a data value is stored as charged on the floating gate; a control gate; a control gate capacitor coupling the control gate to the floating gate; an erase gate; an erase gate capacitor coupling the erase gate to the floating gate; and an erase control circuit.

20 Claims, 6 Drawing Sheets

METHOD OF ERASING AN EEPROM DEVICE

FIELD OF THE INVENTION

The present invention relates to memory cells and in particular to Electronic Erasable Programmable Read Only Memory (EEPROM) devices.

BACKGROUND OF THE INVENTION

Non-volatile memory devices are well known in the art. In general, non-volatile memory devices comprise a series of transistors, which act as memory cells. One such EPROM device, here an ultraviolet (UV) erasable EPROM cell 10, is shown in FIG. 1 to include a pair of heavily doped, here N+, source and drain regions 12, 14 formed in a field oxide 11 isolated P type conductivity well 16 of a P type conductivity silicon body 18. A carrier channel 20 is disposed between the pair of source and drain regions 12, 14. Disposed over the carrier channel 20 is a floating polycrystalline silicon gate 22 separated by dielectric layer 23 from the channel 20 and from a control gate 24 by a dielectric layer 26. The dielectric layer 23 is typically a thermally grown silicon dioxide layer used to form a gate oxide for dielectric separation between the floating gate 22 and the surface of the silicon, (i.e., to prevent the floating gate 26 from short circuiting the source and drain regions 12, 14). The dielectric layer 26 is typically silicon dioxide, or silicon dioxide and silicon nitride, used between the floating gate 22 and the control gate electrode 24. It should be noted that the floating gate 22 and the control gate 24 are disposed in a vertical, or self-aligned arrangement. The heavily doped source and drain regions 12, 14, together with the control gate electrode 24, are used for programming the logic state of the cell. More particularly, to program the cell, a relatively high positive voltage, i.e., 12 to 15 volts, is applied to the control gate electrode 24 relative to the drain region 14, with the source region 12 being grounded. This relatively high positive voltage produces a relatively high, vertically oriented, electric field near the drain region 14 of sufficient intensity to attract "hot" electrons generated near the doped drain region 14 through the gate oxide 23 into the floating gate 22. Thus, in this programmed state, (i.e., with "hot" electrons (i.e., carriers) in the floating gate 22,) the threshold voltage of the cell 10 is increased from its initial, UV erased state. Having been programmed, the cell 10 is now operated in a normal operating mode with a lower, i.e., 5 volt, control gate electrode voltage 24. The difference in threshold voltage of the cell 10 is detected to determine storage by the cell of either a logic 0 bit or a logic 1 bit. To remove the stored "hot" electrons from the floating gate, UV light is again directed onto the cell 10 through a passivation layer, not shown, over the surface of the cell 10 and through a UV transparent window, not shown, provided in a package, not shown.

An alternative to using UV light to erase cells employs an applied electric field. These types of devices are referred to generally as EEPROM devices and the present application is directed to these. An example of a prior art EEPROM cell structure and array is described in "A Single Poly CMOS compatible Embedded Flash Memory IP for Low-Cost Applications", JaeChul Lee et al, AP-SOC, November 2002. Each EEPROM cell 31, as shown in FIG. 2, comprises two capacitors 42, 44 and a floating gate transistor 32. The two capacitors are arranged as a split capacitor with a common electrode. The common electrode of the split capacitor is connected to the floating gate 34 of the MOSFET. The other plates of the capacitors are connected to control and erase gates 46, 48. The split capacitor arrangement 42, 44 allows the coupling ratio of the cell to be modified by changing the bias applied to the capacitors therefore allowing different program and erase conditions to be applied across the cell. The source 36 of the MOSFET is typically tied to a reference voltage, for example ground. The drain 38 of the MOSFET is typically referred to as the bit line since this is where the data is read to and from the cell.

For programming, the control and erase gates 46, 48 are pulled high, as shown in FIG. 3, to a pre-defined program voltage $V_{prog}$. By virtue of a coupling ratio across the capacitor arrangement of greater than 0.5, for example 0.6, a high voltage is coupled onto the floating gate. When a high voltage is then applied to the bit line ($V_{b1}$), channel hot electrons (e) are injected across the Si/oxide barrier onto the control gate increasing the threshold voltage, $V_t$, of the EEPROM cell. This is the conventional method for programming an EEPROM cell.

In contrast to the UV erasable EPROM, to erase a cell, the erase gate is pulled high and simultaneously the control gate is pulled to ground as shown in FIG. 4, thereby changing the coupling ratio to be less than 0.5, for example 0.2, which results in a low voltage being coupled to the floating gate. The potential difference across the erase gate capacitor exceeds the voltage required for Fowler Nordheim (FN) tunnelling and the electrons leave the floating gate by FN tunnelling through the erase gate capacitor.

However, the FN tunnelling erase cycle is not self-limiting and extending the erase cycle and/or the number of erase cycles will result in more electrons being removed from the floating gate by FN tunnelling through the erase capacitor and reducing the $V_t$ of the EEPROM cell. This is demonstrated from the graph shown in FIG. 5 which demonstrates the effects on $V_t$ of different erase times for different erase voltages for 100 cycles. It will be observed from the graph that the threshold voltage $V_t$ decreased by over 2V. In such circumstances, if not corrected, there is a danger that the EEPROM threshold voltage $V_t$ could decrease below 0V. In this scenario, the device would always be on and conducting current. Moreover, the effect would not simply be limited to this cell since the current flow on the associated bit line would disturb all cells along that bit line. This is a known problem associated with EEPROM technology.

To address this problem, monitoring algorithms may be employed to check the $V_t$ of a bit during the erase cycle to ensure that the $V_t$ is not too low or the erase procedure is done in multiple steps using FN tunnelling increments to tunnel charge from the floating gate in a controlled manner to prevent over erasure. However, these algorithms slow the erase procedure time.

SUMMARY

The present disclosure provides an alternative method for erasing an EEPROM cell which reduces the need for monitoring algorithms. The present disclosure also provides a new structure for an EEPROM cell.

In a first embodiment, a method for erasing an EEPROM cell is provided where the cell comprises a floating gate transistor having an associated control gate and an erase gate. The method comprises the steps of raising the potential at the erase gate and lowering the potential at the control gate to cause FN tunnelling through the erase gate capacitor, and subsequently raising the potential at the control gate sufficient to start FN tunnelling through the oxide of the transistor.

Suitably, the step of lowering the potential at the control gate comprises connecting the control gate to a reference voltage. Similarly, the step of raising the potential at the erase gate may comprise connecting the erase gate to a first voltage source, whereas the step of raising the potential at the control gate may comprise connecting the control gate to a second voltage source. The first and second voltage sources may be the same. The transistor itself may be a MOSFET. Suitably, the step of raising the potential at the control gate also equalises the potential at the control and erase gates.

In another embodiment a memory device is provided having an EEPROM cell for storing a data value. The EEPROM cell comprises a transistor having a floating gate, where the data value is stored as charge on the floating gate. The cell further comprises a control gate, a control gate capacitor coupling the control gate to the floating gate, an erase gate, an erase gate capacitor coupling the erase gate to the floating gate. The memory device further comprises an erase control circuit for erasing the stored data value. The erase circuit comprises an erase input for connection to an erase voltage source, a reference input for connection to a reference voltage, a soft program input for connection a soft program voltage source, wherein the erase control circuit is configured to initially connect the erase input to the erase gate and the reference input to the control gate and subsequently connect the soft program input to the control gate. Suitably, the floating gate transistor is a MOSFET. The memory device may be included within an integrated circuit. In which case, the erase voltage source and soft program voltage source may also be included within the integrated circuit. In some circumstances, the erase voltage source and soft program voltage source may be the same. Suitably, the erase control circuit may be adapted to couple the bit line of the memory device to the reference voltage. A programming circuit may also be provided for programming the memory device. Suitably, the programming circuit comprises a program input for connection to a programming voltage source and a data input for receiving a data value for storage in the EEPROM cell, wherein the programming is configured to connect the erase gate and control gate to the program input and to connect the data input to bit line of the EEPROM cell to cause the data value to be stored in the EEPROM cell. Advantageously, the memory device may comprise a plurality of EEPROM cells. In this arrangement, the erase circuit may be adapted to selectively erase the contents of individual EEPROM cells. Similarly, where the memory device comprises a plurality of EEPROM cells, the erase circuit may be adapted to simultaneously erase the contents of the plurality of EEPROM cells.

In yet another embodiment, a control circuit is provided for controlling an EEPROM cell comprising a transistor having a floating gate, a control gate, an erase gate. The control circuit comprises an erase command input, an erase input for connection to an erase voltage source, a reference input for connection to a reference voltage, and a soft program input for connection a soft program voltage source, wherein the control circuit is configured in response to receipt of an erase command at the erase command input to cause the initial connection of the erase input to the erase gate of the EEPROM cell and the reference input to the control gate of the EEPROM cell and to subsequently connect the soft program input to the control gate of the EEPROM cell.

The control circuit may be incorporated within an integrated circuit. In which case, the integrated circuit may further comprise the EEPROM cell, the erase voltage source and soft program voltage source. Suitably, the control circuit is adapted to couple the bit line of the EEPROM cell to the reference voltage at the time of connection of the erase input to the erase gate and the reference input to the control gate of the EEPROM cell, and during the subsequent connection of the soft program input to the control gate.

The control circuit may further comprise a program command input for receiving a program command, a program input for connection to a programming voltage source, a data input for receiving a data value for storage in the EEPROM cell. In this arrangement, the control circuit may be configured, in response to receipt of a program command, to connect the erase gate and control gate to the program input and to connect the data input to the bit line of the EEPROM cell to cause the data value to be stored in the EEPROM cell.

BRIEF DESCRIPTION OF THE DRAWINGS

The present invention will now be described with reference to the accompanying drawings in which.

DETAILED DESCRIPTION OF THE DRAWINGS

Figure 1:
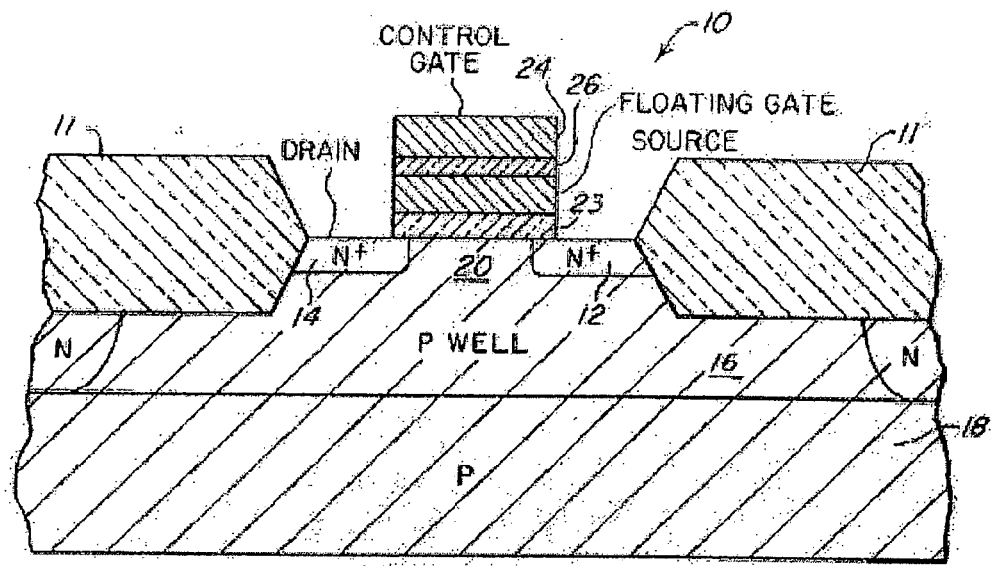
FIG. 1 is a diagrammatic, cross-sectional sketch of an EPROM cell according to the PRIOR ART.
Figure 2:
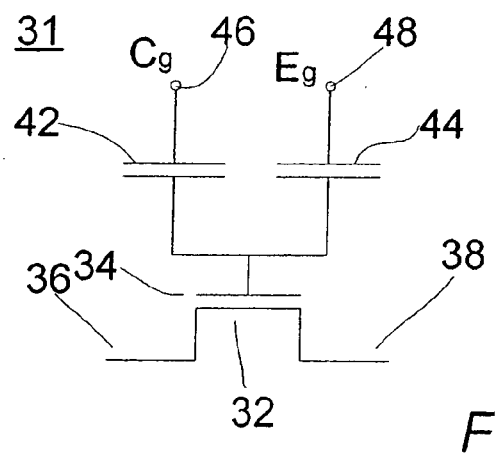
FIG. 2 is a representation of the equivalent circuit of an EEPROM memory cell known from the PRIOR ART.
Figure 3:
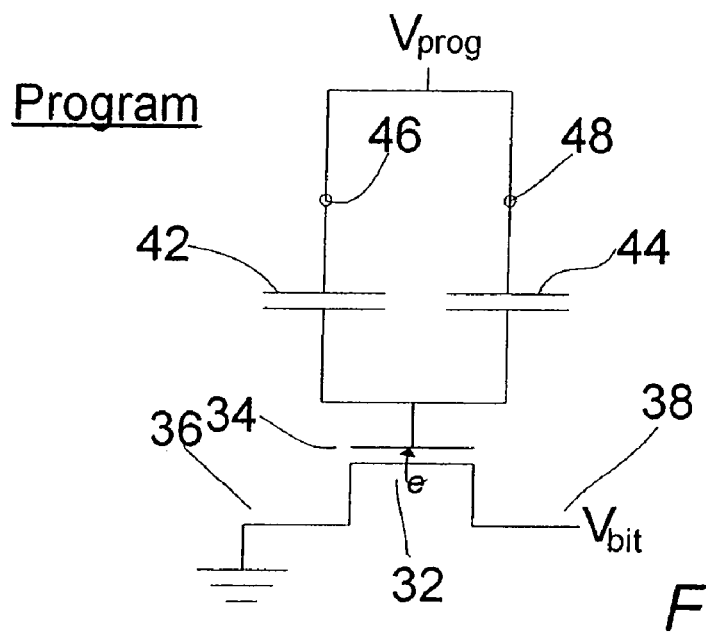
FIG. 3 is a schematic representation of the arrangement of the cell of FIG. 2 connected in a program mode according to the PRIOR ART.
Figure 4:
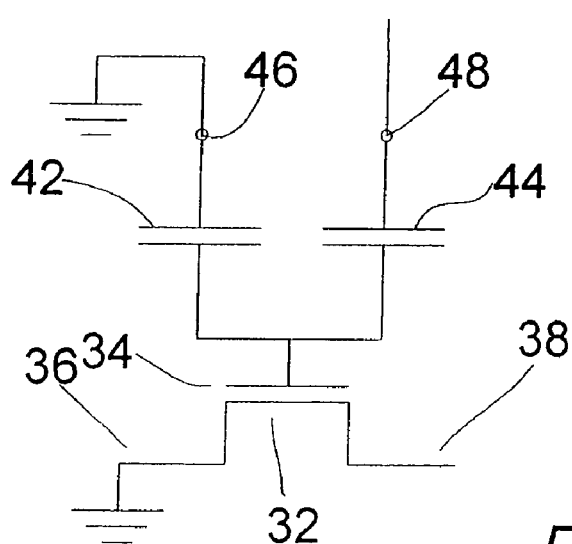
FIG. 4 is a schematic representation of the arrangement of the cell of FIG. 2 connected in an erase mode according to the PRIOR ART, FIG. 5 demonstrates the problem associated with repeated erasure of a cell's contents by the method of the PRIOR ART
Figure 5:
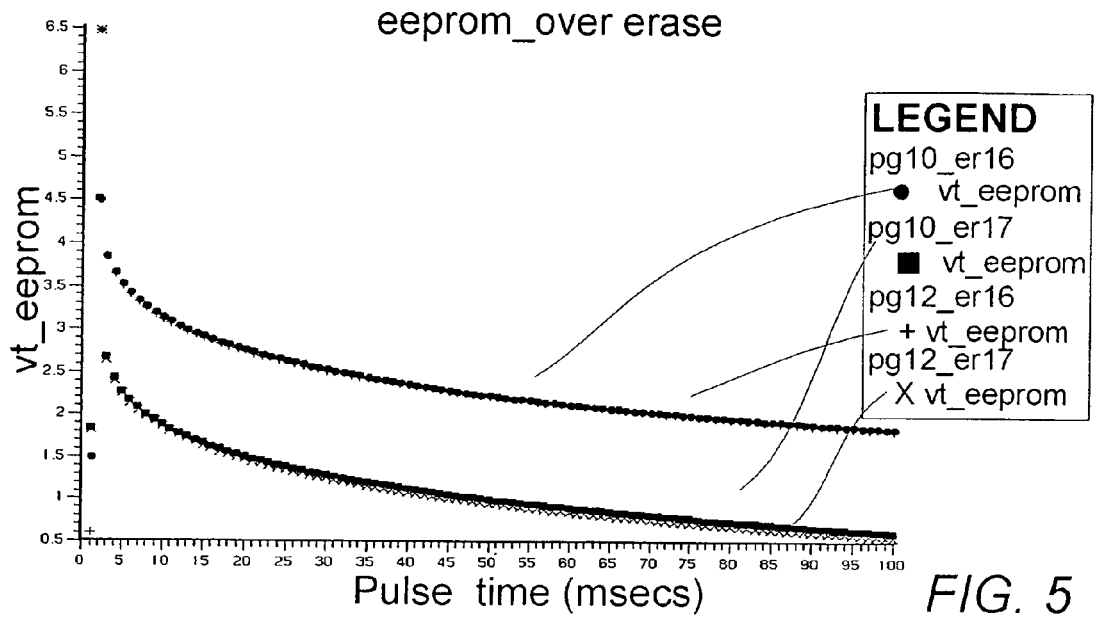
Figure 6:
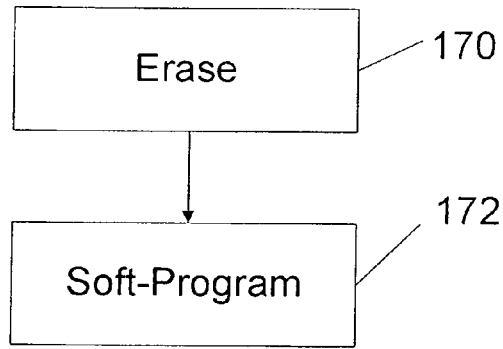
FIG. 6 is a flowchart representation of a method of erasing a cell's contents according to an embodiment of the present application.
Figure 7:
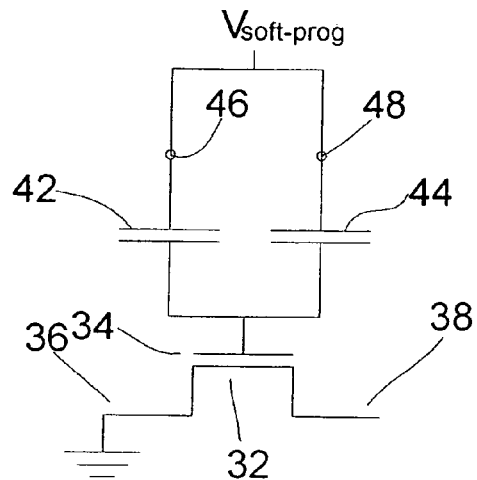
FIG. 7 is a schematic representation of the arrangement of the cell of FIG. 2 connected in a soft program mode for the soft program step of FIG. 6 according to an embodiment of the present application, FIG. 8 demonstrates the improvement of the method of the present application over the prior art method, FIG. 9 demonstrates an exemplary circuit for implementing the method of FIG. 6.
Figure 8:
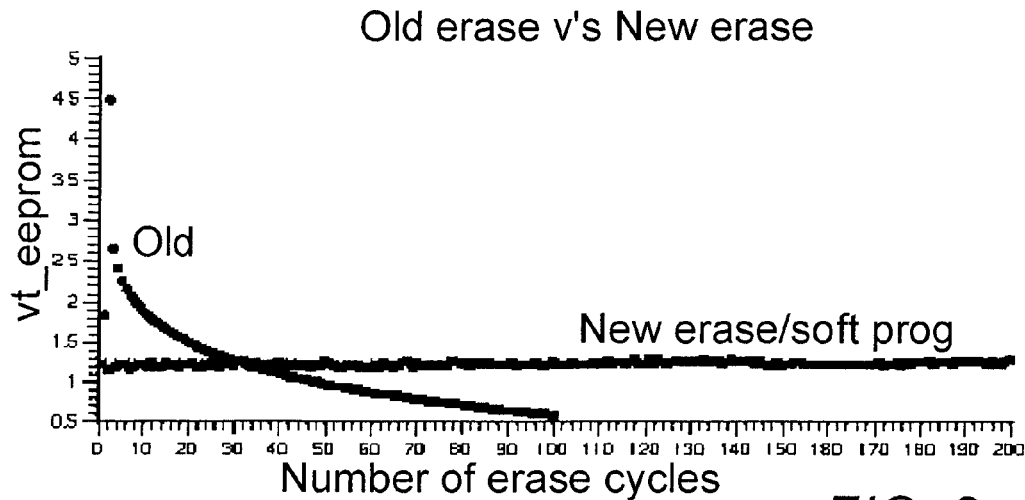

In the present application, a method is described for erasing the content of an EEPROM cell. The method, as shown in the exemplary flowchart of FIG. 6, comprises two main steps. The first step 170 is substantially the same method employed in the prior art reference of JaeChul Lee et al to erase a cell, i.e., raising the erase gate voltage and grounding the control gate so as to cause FN tunnelling through the erase gate capacitor. As before the FN tunnelling removes charge from the floating gate of MOSFET. A subsequent step 172 is employed to complete the erasure process. This subsequent step raises the control gate voltage from ground to a suitably high voltage level by connecting the control gate 46, as shown in FIG. 7, to a voltage source, referred to hereinafter as the Soft-Program Voltage ($V_{soft-prog}$). The Soft-Program Voltage, which is suitably predefined to be a level sufficient to cause FN tunnelling through the oxide of the MOSFET and thus raise the $V_t$ of the EEPROM cell. The erase gate voltage may also be coupled to the $V_{soft-prog}$ or left connected to $V_{erase}$. Moreover, with careful design, the same voltage may be used for $V_{soft-prog}$ and $V_{erase}$ thus reducing the requirement for the number of voltage sources. This will be discussed in greater detail below.

In the soft-program step 172, the connection of the control gate 46 to $V_{soft-prog}$ increases the coupling ratio >0.5 and causes $V_{soft-prog}$ to be coupled onto the floating gate 34 of the MOSFET and a potential develops across the oxide of the MOSFET. It should be noted that the mechanism behind the soft-charge mechanism is FN tunnelling through the oxide of the MOSFET rather than the mechanism of channel hot electrons injection, which is employed during the program step. The potential across the oxide of the MOSFET will depend on the charge already present on the floating gate, so that over erased cells or cells with fewer electrons present will develop a higher potential and increase their FN tunnelling current. This provides for an auto-correction for over-erased cells. The method may be applied to an entire page or memory array as the current levels are low. Moreover, the method ensures that during the erase cycle of a page or entire memory array, unprogrammed bits will be soft programmed back to a controlled $V_t$ eliminating the requirement for monitoring and read algorithms.

Figure 9:
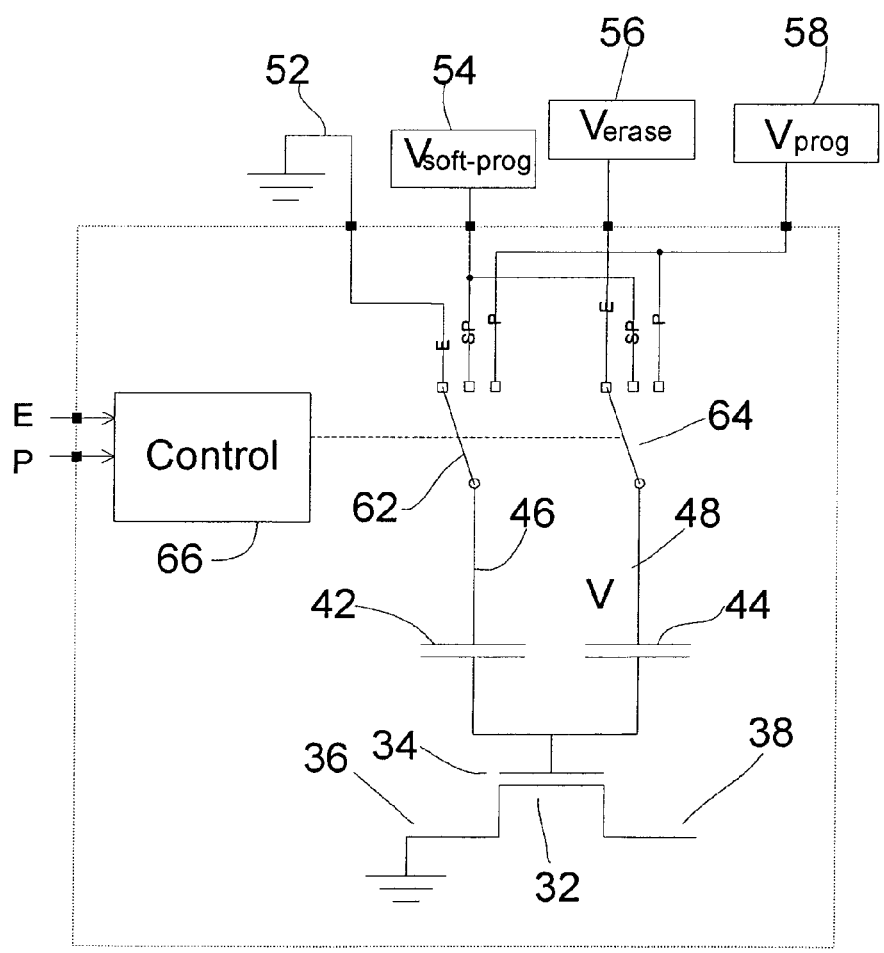

The method will be described in greater detail with reference to the exemplary circuit arrangement of FIG. 9. The circuit arrangement comprises the memory cell 31 described previously, an associated control circuit 66 and three voltage sources 54,56,58. The three voltage sources comprise a soft programming voltage source 54, a erase voltage source 56 and programming voltage source 58. It will be appreciated that techniques for providing voltage sources are well known in the art. The voltage sources may be provided on the same integrated circuit as the memory cell 31 and control circuitry 66 or provided externally. The voltage sources 54, 56, 58 are connected to respective inputs of the control circuit. In particular, an erase input is provided for connection to the erase voltage source, a soft program input is provided for connection to the soft program voltage source and a program input is provided for connection to a programming voltage source. As described previously, the erase and soft program voltage sources and hence their associated inputs may be the same. A reference input is also provided to connect a reference voltage, e.g. ground, to the control circuit.

The control circuit also has a number of command inputs. These command inputs include an erase command input E where the control circuit receives an instruction, typically identified by a logic level, to erase the contents of a cell. A program command input P is also provided for receiving a program command to store contents in the cell. The content to be stored is provided on the bit line 38.

The inputs are connected by means of switches 62, 64 to the Control and Erase gates in response to commands received from the control circuit 66. More particularly, the control circuit is configured in response to receipt of an erase command at the erase command input to cause the initial connection of the erase input to the erase gate of the EEPROM cell and the reference input to the control gate of the EEPROM cell. The duration of the switching is selected to be sufficient to eliminate the contents of the cell in substantially the same manner as the prior art. Subsequently and also in response to the erase command, the control circuit is configured to disconnect the reference input from the control gate of the EEPROM cell and switch the soft program input to the control gate of the EEPROM cell. At the same time, the control circuit may cause the disconnection of the erase input from the erase gate and the connection of the soft program input to the erase gate. After soft programming, the inputs may be disconnected from the control and erase gates. During the erase and soft programming, the bit line of the EEPROM cell may be connected to the reference voltage or left floating.

It will be appreciated by those skilled in the art that the control and switching circuitry may be implemented in a variety of different ways without undue burden and may include, for example, the use of timing circuitry, delays, latches, logic circuitry and transistor switches.

Once the contents of the cell have been erased, the cell may be programmed in the conventional way known from the prior art. In the exemplary arrangement shown, this would comprise the control circuit coupling a data value received at a data input for storage in the EEPROM cell to the bit line of the EEPROM cell and connecting the erase gate and control gate to the program input and to connect the data input to cause the data value to be stored in the EEPROM cell.

Also with careful selection of capacitor area ratio's, a single $V_{erase}$ may be used for the soft program sequence described above resulting in a single voltage power supply for the combined sequence.

Figure 10:
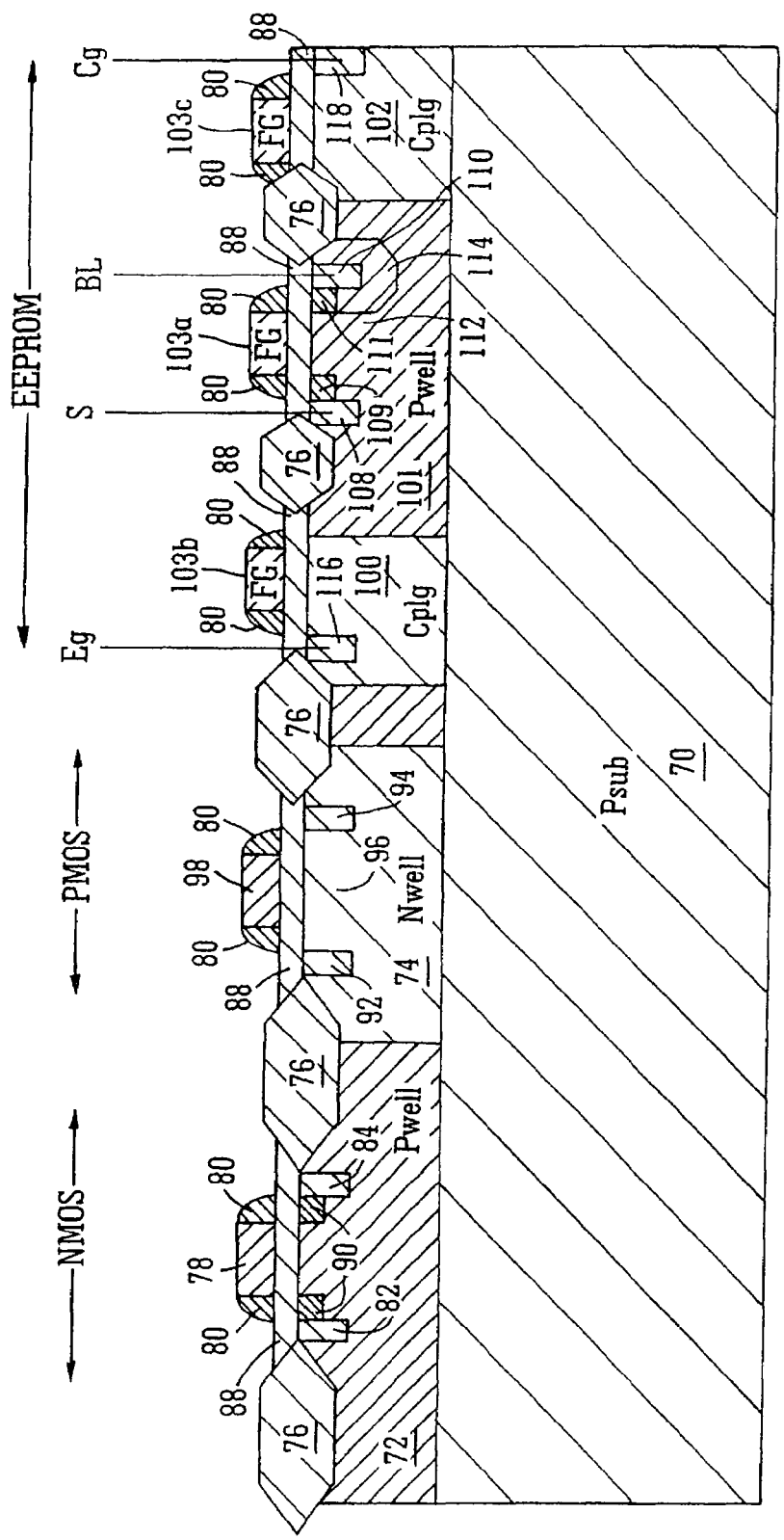
FIG. 10 is a diagrammatic, cross-sectional sketch of an EEPROM cell according to a further embodiment of the present application.

The previously discussed JaeChul Lee et al reference describes the construction of a EEPROM having a split capacitor with a common electrode connected to the floating gate, the exemplary device discussed was fabricated using deep sub micron (0.25) micron processes. Construction of these devices using shallower sub micron processes, for example greater than 0.4 micron is not practical as the gate oxides are thicker and hence the probability of electrons getting through is reduced which in turn would require high programming and erase voltages which can create problems with other devices on the substrate. Nonetheless, a considerable amount of IC technology is fabricated using conventional CMOS shallow sub micron processes (e.g about 0.5-0.7 micron) which could benefit from the split capacitor arrangement and the method described herein for programming. Accordingly, a further aspect of this application provides a new design of EEPROM having a split capacitor and floating gate arrangement which is suitable for construction in shallower sub micron processes. This construction will now be discussed with reference to FIG. 10.

The fabrication process used to construct this device relies upon standard CMOS/BiCMOS processes. For convenience, these will be referred to generally as CMOS processes. The device comprises a substrate, in the example shown a P type substrate 70. As with conventional CMOS processes NMOS and CMOS devices may be fabricated on the substrate. For example, a P type impurity $P_{well}$ 72 may be provided to form a well region for a NMOS transistor device. Similarly, an N type impurity may be added to form a N-type well 74 region for PMOS devices. Locos oxide 76 may be used to isolate individual devices. It should be appreciated that the PMOS and NMOS transistor regions are included as examples and are distinct from EEPROM cell. They do however demonstrate that the EEPROM cell may be constructed from features and techniques common in CMOS processes and in fact combined with them on the same integrated circuit using common processes.

The NMOS transistor includes a pair of heavily doped, N+, source and drain regions 82, 84 formed in the P type conductivity well 72. A carrier channel 86 is disposed between the pair of source and drain regions 82, 84. Disposed over the carrier channel 86 is a polycrystalline silicon gate 78 separated by dielectric layer 88 from the channel 86. The polisilicon gate may be formed by deposition of a polysilicon layer and subsequent patterned as per standard CMOS processes.

Oxide spacers 80 are used to isolate the edge of the gate 78. These spacers ensure that the highly doped source/drain regions are separated from the edge of the polysilicon gate channel region and act to reduce the generation of hot electrons. A lightly doped n type region 90 is implanted into the source/drain regions of the NMOS device. This N-type LDD (lightly doped drain) region provides a low resistance connection between the highly doped source/drain regions and beneath the polysilcion gate edge underneath the oxide spacers 80. This lightly doped region is generally added to standard NMOS devices to reduce the vertical electrical field at the drain edge of the channel, which reduces the number of electron/holes generated and therefore the number of hot electrons, to prevent MOS characteristics from shifting during normal use due to hot electron damage.

The PMOS device comprises an N-type well in which heavily doped p type regions 92,94 have been implanted into source/drain regions of the PMOS devices to provide low resistance contacts as per standard CMOS processes. A carrier channel 96 is disposed between the pair of source and drain regions 92, 94. Disposed over the carrier channel 96 is a polycrystalline silicon gate 98 separated by dielectric layer 88 from the channel 96. As with the NMOS transistor, oxide spacers 80 are used to isolate the edge of the gate 98. These spacers ensure that the highly doped source/drain regions are separated from the edge of the polysilicon gate channel region and act to reduce the generation of hot electrons.

The structure and construction of the EEPROM cell will now be described starting from the substrate. As with the NMOS and PMOS devices, an impurity, in this case P type, is added to form a well region 101 on the P type substrate. Heavily doped n type regions 100, 102 are added around the Pwell 101. These heavily doped regions are commonly referred to as collector plugs or collector sinkers and are typically used in BiCMOS structures as a low resistance sinker to contact the buried collector region of an NPN device. In the present application, the collector plugs 100, 102 are used to form the top electrodes of the coupling capacitors for the Erase capacitor and Control Capacitor respectively. The plugs are coupled to the floating gate of the EEPROM through the gate oxide which is common to the NMOS, EEPROM and PMOS devices. Since the plugs are more heavily doped than the Nwell region, when a large potential is applied during the program/erase procedures for the EEPROM cell, less depletion spreading will occur into these heavily doped region, resulting in a lower program/erase voltage than if a lower doped Nwell region was used.

The EEPROM Pwell and the plugs are diffused to their required junction depth using standard CMOS processing. As with the PMOS and NMOS devices, locos oxide 76 is grown to isolate the devices. As is conventional in the art, the EEPROM cell includes a pair of heavily doped, N+ regions provided for the source and drain 108, 110 formed in the P type conductivity well 72. An erase gate 116 and a control gate 118 contact region are also suitably provided as heavily doped, N+ regions in the plugs 100, 102 using the same process. The source, drain, erase gate and control gate are typically provided by implanting a dopant. This dopant is typically Arsenic to reduce the lateral/vertical diffusion of the dopant to ensure it does not diffuse beneath the spacer oxide and minimise the generation of hot electrons.

A carrier channel 112 is disposed between the pair of source and drain regions. Disposed over the carrier channel 86 is a polycrystalline silicon gate 78 separated by dielectric layer of gate oxide 88 from the channel 86. The polisilicon gate may be formed by deposition of a polysilicon layer and subsequent patterned as described previously with respect to the NMOS and PMOS devices. The gate oxide 88 is grown over the plugs and the Pwell. The gate oxide grows slightly thicker over the heavily doped plug regions (for example 170 A versus 150 A). This is a well known phenomenon to those skilled in the art. Nonetheless, this oxide is still significantly thinner than inter poly oxides (IPO) which are used as the dielectric in coupling capacitors in the prior art and where the thickness is about 800 Angstrom. It will be appreciated that the lower dielectric thickness results in a lower voltage requirement for the erase condition. The floating gate is provided above the Plug regions and above the Pwell. As described with reference to the NMOS and PMOS devices, oxide spacers 80 may be provided to surround the gate. These spacers ensure that the highly doped source/drain regions are separated from the edge of the polysilicon gate channel region to reduce the generation of hot electrons. Again this is not ideal for the MOS associated with the EEPROM cell as it reduces the program efficiency of the cell. Although, not clear from the illustrated cross sectional representation, the exemplary floating gate is an 'E' shape with the sections above the Plug regions and above the Pwell corresponding to the horizontal arms of the 'E' which are interconnected (not shown). It will be appreciated that other arrangements may be used to provide for a continuous floating gate structure.

As with the NMOS device, lightly doped drain regions 109, 111 are introduced to provide a low resistance connection between the highly doped source/drain regions and beneath the polysilicon gate edge underneath the oxide spacers. As with the NMOS device, this lightly doped region is added to standard NMOS devices to reduce the vertical electrical field at the drain edge of the channel, which reduces the number of electron/holes generated and therefore the number of hot electrons, to prevent MOS characteristics from shifting during normal use due to hot electron damage. However, programming of the MOS associated with the EEPROM relies on hot electrons to cross the gate oxide barrier and onto the floating gate and the presence of this NLDD region in the MOS associated with the EEPROM reduces the program efficiency of the EEPROM cell and for technologies with >100 A no programming will occur.

To assist in the generation of hot electrons, a heavily doped n type region 114 is implanted into the drain EEPROM cell. The use of such a feature has been described previously in U.S. Pat. No. 6,300,662 (which is assigned to the assignee of the present invention) and the entire contents of which are incorporated herein by reference. This type of implant is typically used in the drain/source of MOS devices exposed to ESD events (e.g. NMOS tied to input/output pads). This implant is deeper and diffuses beneath the spacer underneath the polysilicon gate edge to improve the junction performance during an ESD event. In the case of the NMOS within the EEPROM cell, this heavily doped region diffuses beneath the spacer oxide and under the polysilicon gate edge, counteracting the effects of the N-type LDD region. The presence of the highly doped region 114 at the polysilicon gate edge increases the vertical electric field at the drain edge of the channel, increasing the number of electron/holes pairs generated, increasing the number of hot electrons and hence improving the program efficiency of the EEPROM cell. For gate oxide >100 A, it is likely that the EEPROM cell would not program without the presence of this layer owing to the lack of hot electrons.

Oxide layers are deposited, contact holes etched and metalisation connected to the various junctions are carried out as per normal process steps. These features are not shown in order to simplify the drawing and allow easier understanding to the reader. Nonetheless, the connections, bit line, erase, source, and control are identified.

One advantage of the described structure for the EEPROM cell is that, as shown, it may constructed alongside such conventional NMOS and CMOS circuitry with conventional CMOS processing steps. In fact, it will be appreciated from the description above that the structure employs features common in CMOS processes but which hinder the functioning of the EEPROM and would therefore be unlikely to normally be considered. The exemplary structure shown is formed by forming an N type conductivity well 36 in the P type conductivity layer to provide a PMOS transistor region and an N type well to provide a NMOS transistor region as would be found in conventional CMOS circuitry using conventional techniques well known in the art.

Figure 11:
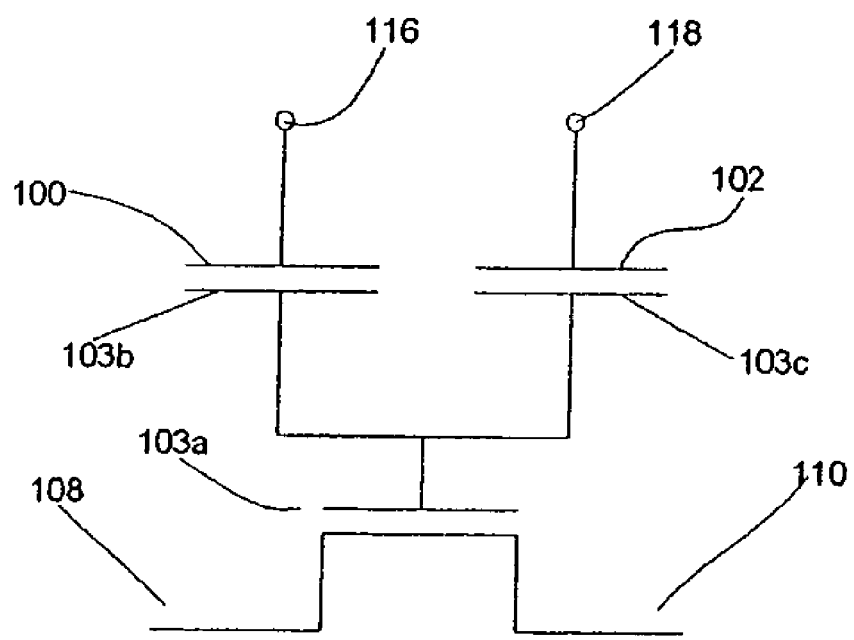
FIG. 11 is an equivalent circuit for the cell of FIG. 10.

The structure of the EEPROM cell will now be explained with reference to the equivalent circuit in FIG. 11. It will be appreciated that the equivalent circuit corresponds to the conventional circuit for a twin capacitor arrangement for EEPROM described previously and that the primary difference is the manner in which the elements are provided. In this regard, the floating plate of the transistor is provide by the polisilicon material 103a situated above the channel region of the EEPROM transistor which in turn separates the drain 110 and source 108 regions. The gate oxide layer acts as dielectric between the channel area and the polisilicon material. The erase gate connection is provided by the heavily doped contact region 116 in the first plug 100. The upper plate of the erase gate capacitor is provided by the plug 100, with the oxide layer 88 acting as the dielectric and floating gate 103b acting as the lower plate of the erase gate capacitor. Similarly, the control gate connection is provided by the heavily doped contact region 118 in the second plug 102. The upper plate of the control gate capacitor is provided by the plug 102, with the oxide layer 88 acting as the dielectric and floating gate 103c acting as the lower plate of the erase gate capacitor. The EEPROM cell may be operated as described herein or less advantageously as described in the prior art.

Other embodiments are within the spirit and scope of the appended claims. The words comprises/comprising when used in this specification are to specify the presence of stated features, integers, steps or components but does not preclude the presence or addition of one or more other features, integers, steps, components or groups thereof.

The invention claimed is:

1. A method for erasing an EEPROM cell which eliminates the need for threshold voltage monitoring, the EEPROM cell comprising a floating gate transistor having a control gate and an erase gate, the method comprising:
   a) raising the potential at the erase gate and lowering the potential at the control gate to cause FN tunnelling through the erase gate, and subsequently
   b) raising the potential at the control gate sufficient to start FN tunnelling through an oxide of the transistor irrespective of the state of the EEPROM cell after the step of raising the potential of the erase gate, whereby erasure is achieved without the need for threshold voltage monitoring.

2. A method according to claim 1, wherein the step of lowering the potential at the control gate comprises connecting the control gate to a reference voltage.

3. A method according to claim 1, wherein the step of raising the potential at the erase gate comprises connecting the erase gate to a first voltage source.

4. A method according to claim 3, wherein the step of raising the potential at the control gate comprises connecting the control gate to a second voltage source.

5. A method according to claim 4, wherein the first and second voltage sources are the same.

6. A method according to claim 1, where the transistor is a MOSFET.

7. A method according to claim 1, wherein the step of raising the potential at the control gate also equalises the potential at the control and erase gates.

8. A memory device having an EEPROM cell for storing a data value, the EEPROM cell comprising:
   a) a transistor having a floating gate, where the data value is stored as charge on the floating gate; a control gate; a control gate capacitor coupling the control gate to the floating gate; an erase gate; an erase gate capacitor coupling the erase gate to the floating gate;
   b) an erase control circuit for erasing the stored data value, the erase circuit comprising:
   i) an erase input for connection to an erase voltage source,
   ii) a reference input for connection to a reference voltage,
   iii) a soft program input for connection to a soft program voltage source, wherein the erase control circuit is configured each time a stored data value is to be erased to:
   initially connect the erase input to the erase gate and the reference input to the control gate, and subsequently
   connect the soft program input to the control gate irrespective of the state of the EEPROM cell, whereby erasure is achieved without the need for threshold voltage monitoring.

9. A memory device according to claim 8, wherein the floating gate transistor is a MOSFET.

10. A memory device according to claim 8, wherein the erase control circuit is adapted to couple the bit line of the memory device to the reference voltage.

11. A memory device according to claim 10, further comprising a programming circuit, the programming circuit comprising:
   i) a program input for connection to a programming voltage source, and
   ii) a data input for receiving a data value for storage in the EEPROM cell, wherein the programming circuit is configured to connect the erase gate and the control gate to the program input and to connect the data input to bit line of the EEPROM cell to cause the data value to be stored in the EEPROM cell.

12. A memory device according to claim 8, wherein the memory device comprises a plurality of EEPROM cells and the erase circuit is adapted to selectively erase the contents of individual EEPROM cells.

13. A memory device according to claim 8, wherein the memory device comprises a plurality of EEPROM cells and the erase circuit is adapted to simultaneously erase the contents of the plurality of EEPROM cells.

14. An integrated circuit comprising the memory device of claim 8.

15. An integrated circuit according to claim 14, further comprising the erase voltage source and the soft program voltage source.

16. An integrated circuit according to claim 15, wherein the erase voltage source and the soft program voltage source are the same.

17. A control circuit for controlling an EEPROM cell comprising a transistor having a floating gate, a control gate, an erase gate, the control circuit comprising:
   a) an erase command input,
   b) an erase input for connection to an erase voltage source,
   c) a reference input for connection to a reference voltage,
   d) a soft program input for connection to a soft program voltage source, wherein the control circuit is configured in response to receipt of an erase command at the erase command input to subsequently connect the soft program input to the control gate of the EEPROM cell irrespective of the state of the EEPROM cell, whereby erasure of the EEPROM cell is achievable without the need for threshold voltage monitoring.

18. The control circuit of claim 17, wherein the control circuit is configured to couple the bit line of the EEPROM cell to the reference voltage at the time of connection of the erase input to the erase gate and the reference input to the control gate of the EEPROM cell, and during the subsequent connection of the soft program input to the control gate.

19. The control circuit of claim 17 further comprising:
i) a program command input for receiving a program command,
ii) a program input for connection to a programming voltage source,
iii) a data input for receiving a data value for storage in the EEPROM cell, wherein the control circuit is configured, in response to receipt of a program command, to connect the erase gate and the control gate to the program input and to connect the data input to the bit line of the EEPROM cell to cause the data value to be stored in the EEPROM cell.

20. An integrated circuit comprising the control circuit of claim 17, the integrated circuit further comprising the EEPROM cell, the erase voltage source and the soft program voltage source.

* * * * *